United States Patent [19]

Tsuchiya et al.

[11] 4,314,162

[45] Feb. 2, 1982

[54] FILTER CIRCUIT UTILIZING CHARGE TRANSFER DEVICE

[75] Inventors: Takao Tsuchiya; Mitsuo Soneda, both of Tokyo, Japan

[73] Assignee: Sony Corporation, Tokyo, Japan

[21] Appl. No.: 109,336

[22] Filed: Jan. 3, 1980

[30] Foreign Application Priority Data

Jan. 12, 1979 [JP] Japan ................................. 54-2782

[51] Int. Cl.³ ..................... G11C 19/28; H03K 17/60; H03K 5/00; H03H 15/02
[52] U.S. Cl. ............................. 307/221 D; 307/255; 307/262; 307/313; 357/24; 333/165
[58] Field of Search ......... 357/24; 307/221 C, 221 D, 307/255, 262, 313; 333/165

[56] References Cited

U.S. PATENT DOCUMENTS

| | | | |
|---|---|---|---|
| 3,546,490 | 12/1970 | Sangster | 357/24 |
| 3,621,283 | 11/1971 | Teer et al. | 307/221 D |
| 3,651,340 | 3/1972 | Cliff | 307/313 |
| 3,798,471 | 3/1974 | Williams et al. | 307/255 |
| 3,916,219 | 10/1975 | Wilmsmeyer | 307/221 D |
| 3,937,982 | 2/1976 | Nakajima | 307/221 C |
| 3,983,408 | 9/1976 | Adam et al. | 307/221 D |
| 3,983,409 | 9/1976 | Adam | 307/221 D |

*Primary Examiner*—Gene M. Munson
*Attorney, Agent, or Firm*—Lewis H. Eslinger; Alvin Sinderbrand

[57] ABSTRACT

A filter circuit of the type utilizing a charge-transfer device, such as a bucket brigade device, comprises a clocking signal drive circuit for supplying a clocking signal; a clock signal generator at whose output a clocking control signal is provided; a transistor whose base is connected to the output of the clock signal generator; a plurality of successive capacitive storage stages for sequentially holding a charge level representing a time-sampled input signal, each of the capacitive storage stages having a clocking electrode for receiving the clocking signal so that the charge level is transferred from one to another of the capacitive storage stages in succession, and at least one of the capacitive storage stages being formed of first and second parallel-connected capacitive circuit portions, and the first and second capacitive circuit portions having respective clocking electrodes coupled to the clock signal generator and to the emitter of the transistor, respectively; and a current feedback circuit, such as a current mirror circuit, for detecting the current flowing through the collector of the transistor and applying a corresponding current to a capacitive storage stage in advance of that stage which is coupled to the emitter of the transistor.

10 Claims, 10 Drawing Figures

FILTER CIRCUIT UTILIZING CHARGE TRANSFER DEVICE

BACKGROUND OF THE INVENTION

1. Field of the Invention

The present invention relates generally to a filter circuit and is directed more particularly to a filter circuit utilizing a CTD (charge transfer device) such as a BBD (bucket brigade device).

2. Description of the Prior Art

In general, a prior art filter circuit is formed as shown in FIG. 1 in which 1 designates an input terminal which is connected to the base of a PNP transistor 2 whose collector is grounded and whose emitter is connected through a resistor 3 to a power supply terminal 4 and also through a diode 5 in the reverse direction to one end of a capacitor C0 the other end of which is connected to a clock terminal 6. The former end of the capacitor C0 is also connected to the emitter of an NPN transistor Q1. The collector of transistor Q1 is connected to the next stage via the emitter of an NPN transistor Q2 in the next stage. Similarly, the collectors and emitters of the NPN transistors Q2 to Q2n (n is a positive integer) are connected in series, and capacitors C1 to C2n are connected between the bases and collectors of the respective transistors Q1 to Q2n, respectively. The capacitance values of the capacitors C1 to C2n are all equal to that of the capacitor C0 so that all have the value C, and the bases of the odd-numbered transistors Q1, Q3, ... $Q_{2n-1}$ are connected through a clock terminal 7 to a clocking signal drive circuit 8, while the bases of the remaining, even-numbered transistors Q2, Q4, ... Q2n are connected through the clock terminal 6 to the clocking signal drive circuit 8.

The clock terminals 6 and 7 are supplied with clock signals $\phi_1$ and $\phi_2$ which have the potentials or levels of $V_{DC}$ and $V_{DC}+V_P$, and which have a duty ratio of 50% and are opposite in polarity, as shown in FIGS. 2A and 2B. The voltage $V_P$ is selected to satisfy the following condition (1) for a voltage $V_{CC}$ applied to the power supply terminal 4:

$$V_{CC} > V_{DC} + 2V_P \quad (1)$$

Further, a voltage $V_S$ of an input signal applied to the input terminal 1 is selected to satisfy the following condition (2):

$$V_{DC} + V_P \leq V_S \leq V_{DC} + 2V_P \quad (2)$$

In the above prior art filter circuit, the capacitors C0 to C2n are all initially charged up to the voltage $V_P$. Further, if the voltage $V_S$ of the input signal is considered to be a DC component $V_{SDC}$ and an AC compound $V_{SAC}$, only the AC component $V_{SAC}$ is initially zero. Accordingly, at the onset, the voltage at the hot-end sides of the even-numbered capacitors C0, C2, ... C2n rises with the clock signal $\phi_1$ (FIG. 2A) momentarily to $V_{DC}+2V_P$ and thereafter falls to $V_{SDC}$; then, as the clock signal $\phi_1$ falls, the voltage at the hot-end side of the even-numbered capacitors falls momentarily to $V_{SDC}-V_P$ and then rises to $V_{DC}+V_P$ as shown in FIG. 2C. The voltage at the hot-end sides of the odd number capacitors C1, C3, ... C2n−1, falls with the clock signal $\phi_2$ (FIG. 2B) to $V_{SDC}-V_P$ momentarily and then rises to $V_{DC}+V_P$; then as the clock signal $\phi_2$ rises, the voltage at the hot-end of the odd-numbered capacitors rises momentarily to $V_{DC}+2V_P$ and then falls to $V_{SDC}$ as shown in FIG. 2D.

Immediately after the input signal is applied, during high voltage portion of the first clock signal $\phi_1$, if the voltage $V_S$ of the input signal is taken initially as $V_{S1}$ (so that $V_S=V_{S1}$), the potential at the hot-end side of the capacitor C0 rises to $V_{DC}+2V_P$ and then falls to $V_{S1}$, that is, the capacitor C0 becomes discharged and stores the charge of $\{V_{S1}-(V_{DC}+V_P)\}C$. At this time, since the transistor Q1 is OFF, no change occurs in the capacitors C1, C2, ... C2n.

During the time that the clock signal $\phi_2$ has the value $V_{DC}+V_P$ the potential of the clock signal $\phi_1$ becomes $V_{DC}$, so that the potential at the hot-end side of the capacitor C0 becomes $V_{S1}-(V_{DC}+V_P)+V_{DC}=V_{S1}-V_P$. Since the transistor Q1 is biased ON, the potential at the hot-end side of the capacitor C0 increases eventually to the base potential $(V_{DC}+V_P)$ of the transistor Q1. At this time, since the transistor Q1 operates in its active region, i.e., below the region of saturation of emitter current, the capacitor C0 is charged up through the path of the terminal 7, capacitor C1, the collector-emitter path of the transistor Q1 and capacitor C0. Since the voltage at the hot-end side of the capacitor C0 changes from $V_{S1}-V_P$ to $V_{DC}+V_P$, the charge transfer from the hot-end side of the capacitor C1 to the hot-end side of the capacitor C0 is expressed by the following equation (3):

$$\{(V_{DC}+V_P)-(V_{S1}-V_P)\}C = (V_{DC}+2V_P-V_{S1})C \quad (3)$$

As the charge of $V_P \cdot C$ is initially stored in the capacitor C1, its final amount of charge is given as follows:

$$V_P C - (V_{DC}+2V_P-V_{S1})C = \{V_{S1}-(V_{DC}+V_P)\}C \quad (4)$$

That is, during the time that clock signal $\phi_1$ has the potential, $V_{DC}+V_P$ the voltage of the capacitor C0 is $V_{S1}-(V_{DC}+V_P)$, but this voltage is transferred to the capacitor C1 during the time that clock signal $\phi_2$ has the potential $V_{DC}+V_P$, so that the voltage of the capacitor C0 returns to $V_{DC}+V_P$. At this time, since the transistor Q2 is OFF, the voltage appearing at the hot-end side of capacitors C2, C3, ... C2n are not changed.

Further, during the time that clock signal $\phi_1$ has the potential $V_{DC}+V_P$, if the voltage $V_S$ of the input signal is $V_{S2}$ (so that $V_S=V_{S2}$), the capacitor C0 is charged up to $V_{S2}-(V_{DC}+V_P)$, the capacitor C1 is returned to $V_{DC}+V_P$ and the capacitor C2 is charged up to $V_{S1}-(V_{DC}+V_P)$. Since the Q3 is biased OFF, the capacitors C3, ... C2n are not changed. The above operation recurs continuously and the signal is transferred from the left to right of the sheet of FIG. 1 in synchronism with the clock signals $\phi_1$ and $\phi_2$.

When a transversal filter of, for example, a cyclic type, includes the above device, a plurality of mid taps are provided, signals with different delay times are derived therethrough, the signals are weighted with a predetermined value while being added successively, and the added signals are fed back to a predetermined portion of the preceding or former stage. Such a prior art transversal filter operates as follows.

As shown in FIG. 1, the hot-end sides of the capacitors C4, C6 and C8, from which signals are derived, are connected to emitter follower circuits 91, 92, and 93, respectively. The output signals from the emitter follower circuits 91, 92, and 93 are supplied through weighting circuits 94, 95, and 96 to an analog adding circuit 97 which supplies an added signal to a sampling hold circuit 98. The output side of the sampling hold circuit 98 is connected to the hot-end side of the capacitor C2 in the former stage.

According to the circuit of FIG. 1, the signals from the mid taps are delivered through the emitter follower circuits as voltages, the voltages are weighted at desired values and then the weighted voltages are added in an analog fashion. The added signal is supplied to the capacitor at the former stage as the charge to be fed back.

In the prior art circuit of FIG. 1, the outputs from the capacitors are derived through emitter follower circuits, and the collector-base capacitance $C_{CB}$ of such emitter follower circuits adversely affects their base currents $I_B$, so that the effective pulse height of the clock signal is reduced, transfer efficency is deteriorated and the dynamic range of the signal is lowered.

Further, in the prior art, an analog adding circuit and an analog sampling hold circuit are used, so that many elements are required, a great deal of electric power is consumed, and the cost of constructing the circuit becomes high.

Further, a spike current flows through the emitter follower circuit, analog adding circuit and sampling hold circuit, and this spike current adversely affects the other circuits through the power source and ground.

In addition, it is very difficult for the DC potential at the input side of the emitter follower circuit to coincide with that at the output side of the sampling hold circuit.

OBJECTS AND SUMMARY OF THE INVENTION

Accordingly, an object of the present invention is to provide a novel filter circuit utilizing a CTD.

Another object of the invention is to provide a filter circuit utilizing a CTD free of the defects inherent to the prior art.

According to an aspect of the present invention a filter circuit is provided of the type utilizing a charge transfer device, such as a bucket brigade device, comprises a clocking signal drive circuit for supplying a clocking signal; a clock signal generator at whose output a clocking control signal is provided; a transistor whose control electrode is connected to the output of the clock signal generator; a plurality of successive capacitive storage stages for sequentially holding a charge level representing a time-sampled input signal, each of the capacitive storage stages having a clocking electrode for receiving the clocking signal so that the charge level is transferred from one to another of the capacitive storage stages in succession, at least one of the capacitive storage stages being formed of first and second parallel-connected capacitive circuit portions, the first and second capacitive circuit portions having respective clocking electrodes coupled to the clock signal generator and to one current-carrying electrode of the transistor, respectively; and a current feedback circuit, such as a current mirror circuit, for detecting the current flowing through a second current-carrying electrode of the transistor and applying a corresponding current to a capacitive storage stage in advance of the at least one stage that is coupled to the one current-carrying electrode of the transistor.

The above and other objects, features, and advantages of the present invention will become apparent from the following description taken in conjunction with the accompanying drawings throughout which like references identify the same elements and parts.

BRIEF DESCRIPTION OF THE DRAWINGS

FIGS. 2A to 2D are waveform diagrams used for explaining the circuit shown in FIG. 1;

DESCRIPTION OF THE PREFERRED EMBODIMENTS

The present invention will be hereinafter described with reference to the attached drawings.

Figure 1:
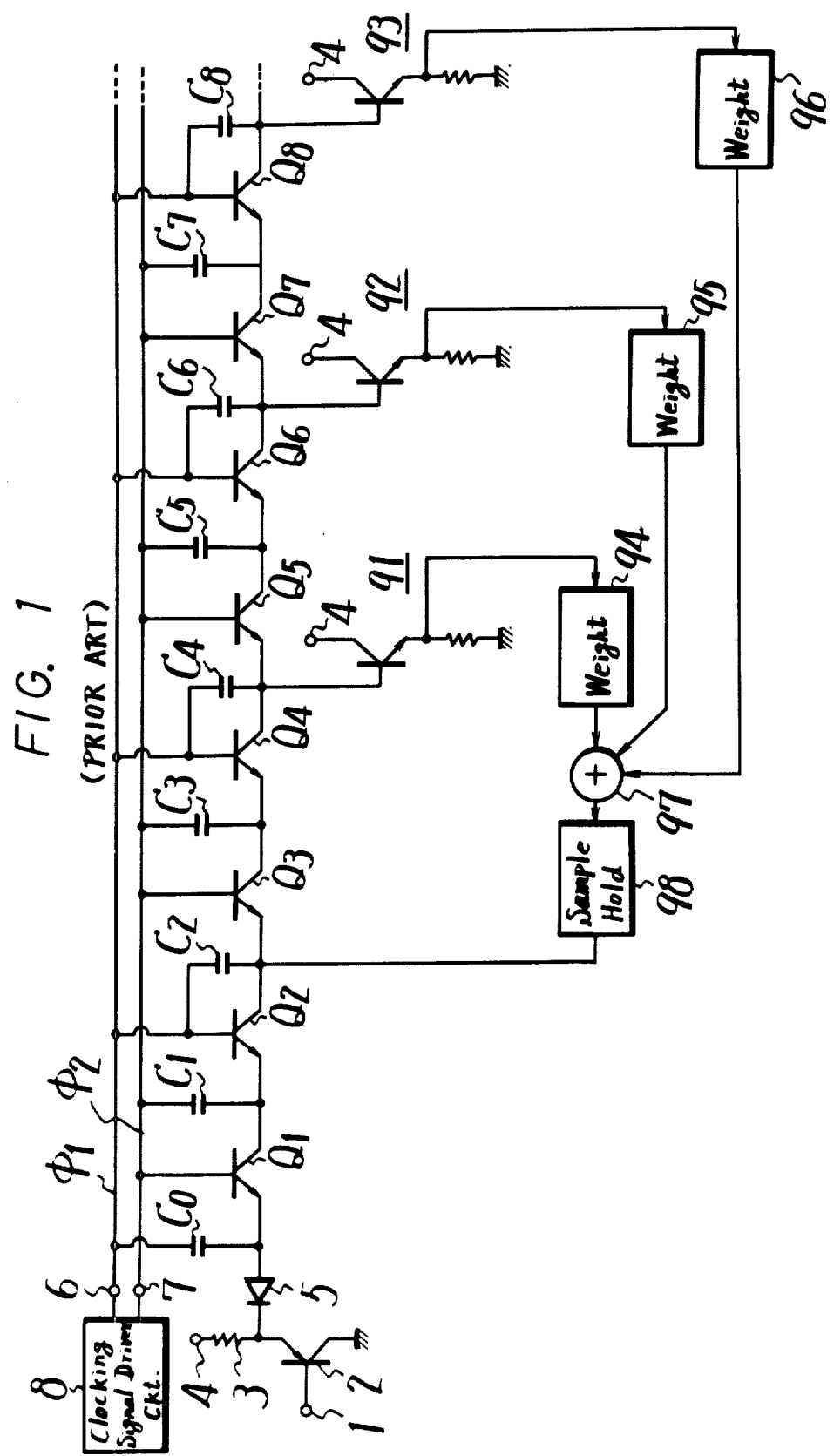
FIG. 1 is a circuit diagram showing an example of a prior art filter circuit.
Figure 2C:
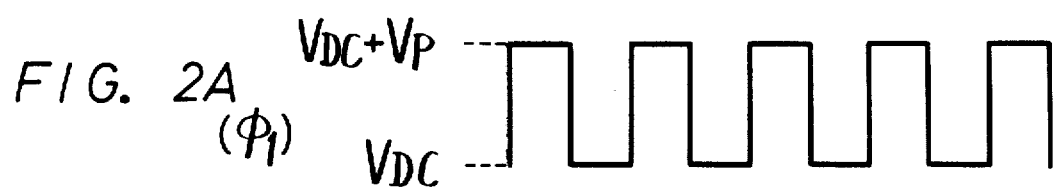
Figure 2C:
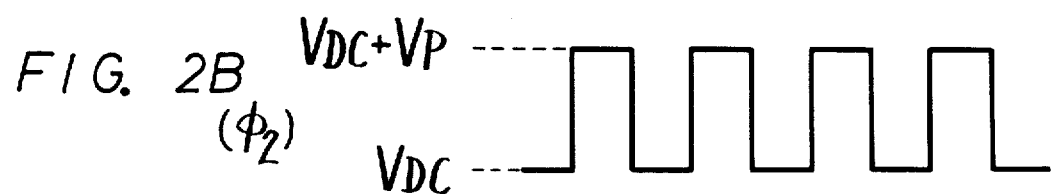
Figure 2C:
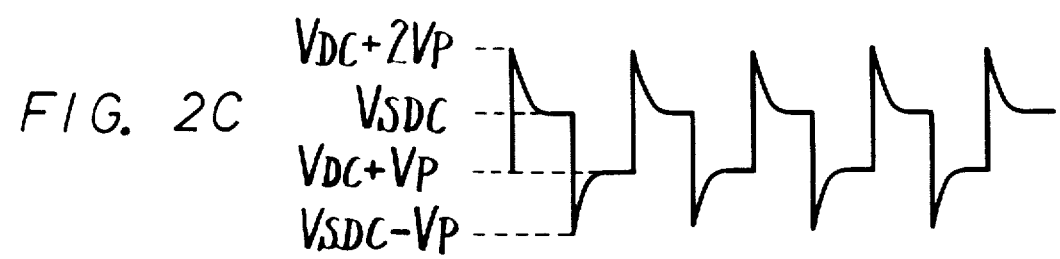
Figure 2D:
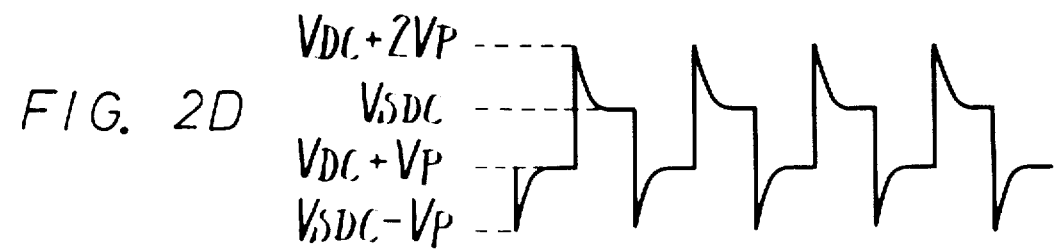
Figure 3:
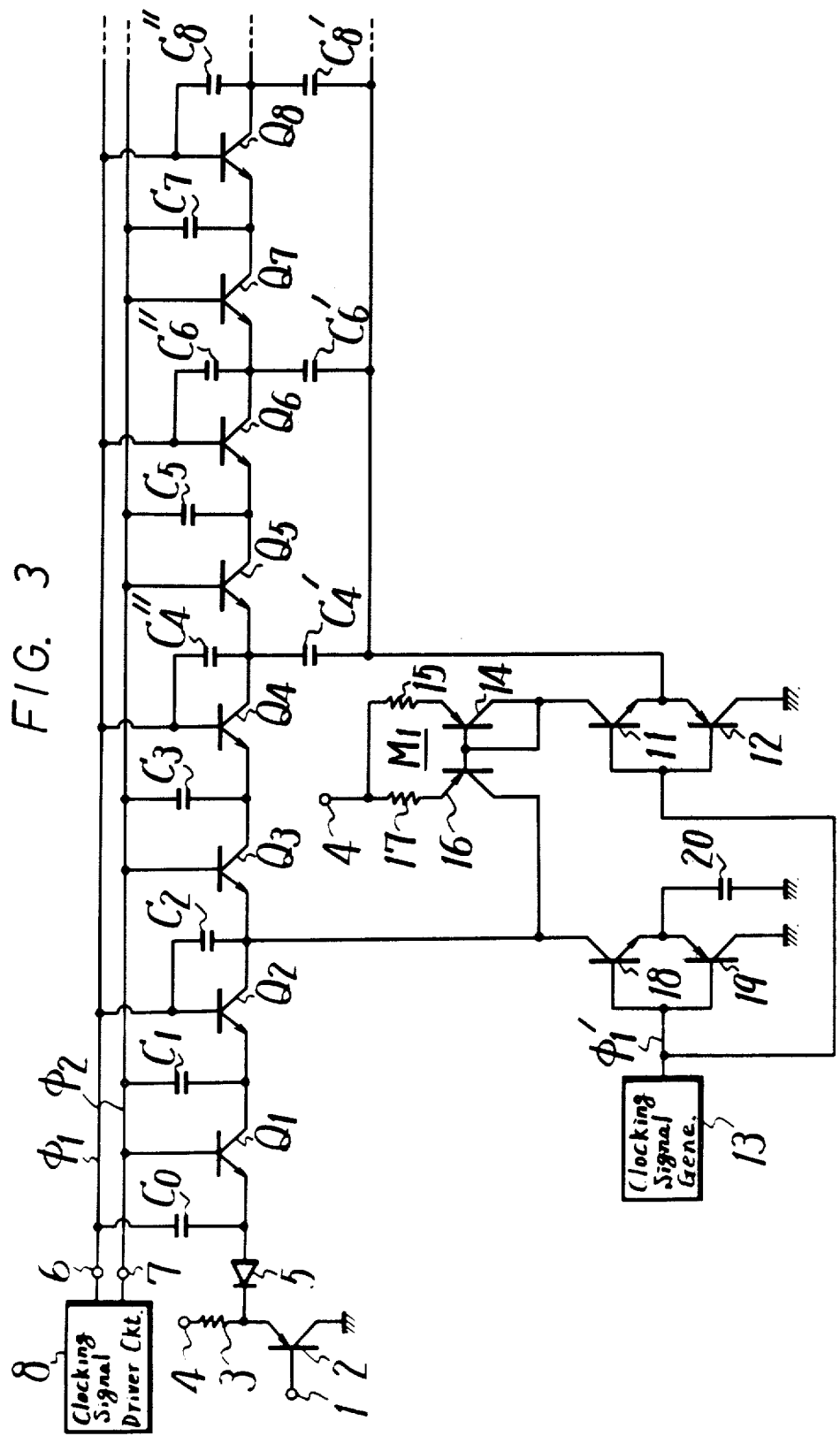
FIG. 3 is a connection diagram showing an example of the present invention.

A first example of the filter circuit according to the present invention utilizing a CTD such as a BBD, in which negative feedback is employed, will be described with reference to FIG. 3. In the example of FIG. 3, even-numbered capacitors C4, C6, . . . are divided, that is, are formed of pairs of capacitors C4', C4''; C6', C6''; . . . whose capacitances are selected as a4C, $(1-a4)C$; a6C, $(1-a6)C$; . . . respectively. The cold-end sides of the divided capacitors C4', C6', . . . are connected together, and the cold-end sides of the other divided capacitors C4'', C6'', . . . are connected to the terminal 6.

Complementary transistors 11 and 12 are provided whose emitters are connected together to the cold-end sides of the divided capacitors C4', C6', . . . and whose bases are connected together to the output side of a clocking signal generator 13. This generator 13 delivers a signal $\phi 1'$ which is the same in phase and frequency as the signal $\phi 1$ and takes on potentials of $V_{DC}-V_{BE}$ and $V_{DC}+V_P+V_{BE}$ (where $V_{BE}$ is the base-emitter voltage of the transistors 11 and 12). The collector of the PNP transistor 12 is grounded and the collector of the NPN transistor 11 is connected to the collector and base of a PNP transistor 14 which forms part of a current mirror circuit M1. The emitter of the transistor 14 is connected through a resistor 15 to the power supply terminal 4. The base of a PNP transistor 16, which with the transistor 14 forms the current mirror circuit M1, is connected to the base of the transistor 14. The emitter of the transistor 16 is connected through a resistor 17 to the power supply terminal 4 and the collector thereof is connected to the hot-end side of the capacitor C2 in the preceding stage. Here, the resistors 15 and 17 are selected equal in value. Transistors 11 and 12 are biased so that they are in their active regions, where their emitter currents are below the level of saturation.

Complementary transistors 18 and 19 are also provided whose emitters are connected together to ground through a capacitor 20 and whose bases are connected together to the output side of the clocking signal generator 13. The collector of the NPN transistor 18 is connected to the hot-end side of the capacitor C2, and the collector of the PNP transistor 19 is grounded. The capacitance $C_x$ of the capacitor 20 is selected to satisfy the following equation (5) under the assumption that the relationship of $V_{SDC}$ to $V_P$ is $V_{SDC}-V_{DC}=(2-k)V_P$;

$$C_x = k(a4 + a6 + \ldots)C \tag{5}$$

In the circuit shown in FIG. 3, when no input signal is supplied, the terminal voltages of all the capacitors are $V_P$. While, during the time that clock signal $\phi 1$ is $V_{DC}+V_P$ immediately after an input signal is supplied, if the voltage $V_{S1}$ of the signal supplied is taken as $V_{S1}$ (where $V_S=V_{S1}$) the terminal voltage of the capacitor C0 is changed from $V_P$ to $V_{S1}-(V_{DC}+V_P)$. Further, during the time that signal $\phi 1$ is $V_{DC}+V_P$ after one clock period $\tau(\tau=1/f_c$, where $f_c$ is the clock frequency), the terminal voltage of the capacitor C2 is changed from $V_P$ to $V_{S1}-(V_{DC}+V_P)$.

During the time that signal $\phi 1$ is $V_{DC}+V_P$ following two periods or $2\tau$, the terminal voltages of both the capacitors C4' and C4" are changed from $V_P$ to $V_{S1}-(V_{DC}+V_P)$ and during this time the charge as expressed by the following equation (6) is discharged from the capacitor C4' through the collector of the transistor 11:

$$a4CV_P - a4C\{V_{S1}-(V_{DC}+V_P)\} = a4C\{(V_{DC}+2V_P)-V_{S1}\} \quad (6)$$

During the time that signal $\phi 1$ is $V_{DC}+V_P$ following three periods or $3\tau$, the capacitor C6' is discharged through the collector of the transistor 11. The discharging charge at this time is expressed as follows:

$$a6CV_P - a6C\{V_{S1}-(V_{DC}+V_P)\} = a6C\{(V_{DC}+2V_P)-V_{S1}\} \quad (7)$$

During the time that signal $\phi 1$ is $V_{DC}+V_P$ following four periods or $4\tau$, the capacitor C8' is discharged through the collector of the transistor 11. The discharging charge at this time is expressed as follows:

$$a8CV_P - a8C\{V_{S1}-(V_{DC}+V_P)\} = a8C\{(V_{DC}+2V_P)-V_{S1}\} \quad (8)$$

Since all the discharging charges flow through the collector of the transistor 11, the amount of charge X flowing through the collector of the transistor 11 is expressed as follows:

$$X=\{(V_{DC}+2V_P)-V_S\}C(a4Z^{-2}+a6Z^{-3}+a8Z^{-4}\ldots) \quad (9)$$

where $Z=e^{s\tau}$, $S=j2\pi f$, and f is the frequency of the input signal.

That is, through the collector of the transistor 11 there flows a charge corresponding to the value of the input signal $V_S$ delayed by $2\tau, 3\tau, 4\tau, \ldots$, weighted by a4, a6, a8, ... and then added.

The average or mean value $I_{AV}$ of the current caused by the flowing of the above charge is expressed as follows:

$$I_{AV}=X/\tau=X\cdot f_c \quad (10)$$

Since the current $I_{AV}$ flows through the transistor 14, a current equal to the current $I_{AV}$ flows through the transistor 16. As a result, an amount of charge X is injected into the capacitor C2 during the corresponding one clock period ($\tau$). Accordingly, the capacitor C2 is supplied with the charges from the transistor 16 and capacitor C2 and the amount of charge supplied from the capacitor C2 is reduced by the charge X supplied from the transistor 16. That is, negative feedback is effected by the charge X.

By reason of this negative feedback, the transfer function H(Z) from the input terminal to the hot-end side of the capacitor C2 is expressed as follows:

$$H(Z) = \frac{Z^{-1}}{1+a4Z^{-1}+a6Z^{-2}\ldots} \quad (11)$$

Although the signal $V_S$ is added in this feedback operation both with the AC component $V_{SAC}$ and also with the DC component $V_{SDC}$, this DC component is removed by the DC correction circuit consisting of the transistors 18, 19 and capacitor 20.

According to the present invention, the feedback is carried out as described above. In this invention, the feedback signal is derived as the charge itself, so that the adding and injecting operations can be easily performed and hence it is unnecessary to use any analog adding circuit or sampling hold circuit.

Further, since the pulse same as that upon normal transfer is applied to the capacitors in this invention, no adverse effect befalls the signal transferred by the BBD.

In addition, the fluctuation of the DC voltage can be easily removed by this invention, and hence the DC portion of the input signal can be stabilized.

Figure 4:
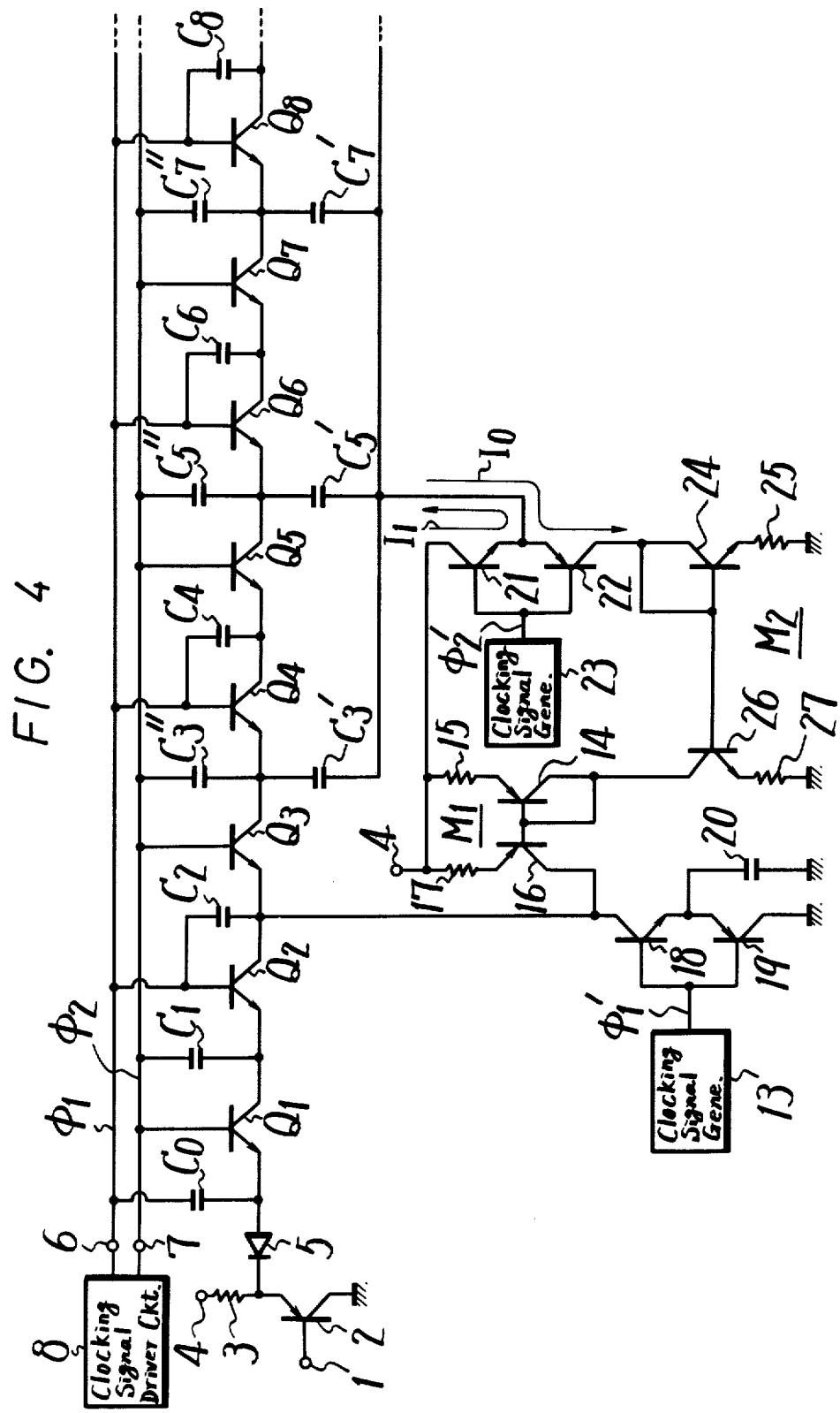
FIGS. 4 to 7 are respectively connection diagrams showing other examples of the invention.

FIG. 4 shows another example of the present invention. In the example of FIG. 4, the signals from the odd-numbered capacitors are used to apply the negative feedback. That is, the odd-numbered capacitors C3, C5, ... are respectively divided into pairs of capacitors C3', C3"; C5', C5"; ... whose capacitances are selected as a3C, (1−a3)C; a5C, (1−a5)C; .... The cold-end sides of divided capacitors C3', C5' ... are connected together and the cold-end side of the other divided capacitors C3", C5", ... are connected to the terminal 7. Complementary transistors 21 and 22 are provided whose emitters are connected together to the cold-end sides of the capacitors C3', C5', .... The bases of the transistors 21 and 22 are connected together to the output side of a clocking signal generator 23 which produces a signal $\phi 2'$ which the same in phase and frequency as the signal $\phi 2$ and takes on the voltages of $V_{DC}-V_{BE}$ and $V_{DC}+V_P+V_{BE}$. The collector of the NPN transistor 21 is connected to the power supply terminal 4, and the collector of the PNP transistor 22 is connected to the collector and base of an NPN transistor 24, which forms part of a second current mirror circuit M2 and whose emitter is grounded through a resistor 25.

The base of an NPN transistor 26, which together with transistor 24 forms the second current mirror circuit M2, is connected to the base of the transistor 24. The emitter of the transistor 26 is grounded through a resistor 27. Here, the resistance values of the resistors 25 and 27 are selected equal with each other. The collector of the transistor 26 is connected to the collector and base of the transistor 14 of the current mirror circuit M1, and the collector of the transistor 16 of the current mirror circuit M1 is connected to the hot-end side of the capacitor C2.

Further, the collector of the transistor 18, which forms a part of the DC correction circuit, is also connected to the hot-end side of the capacitor C2. The capacitance $C_x$ of the capacitor 20 is selected as follows:

$$C_x=k(a3+a5+\ldots)C \quad (12)$$

In the circuit shown in FIG. 4, when no input signal is supplied, the terminal voltages of all the capacitors are $V_P$. When the input signal is supplied, during the time that signal $\phi 1$ is $V_{DC}+V_P$ immediately thereafter, the capacitor C0 is charged up to the terminal voltage of $V_{S1}-(V_{DC}+V_P)$. During the time following this that signal $\phi_2$ is $V_{DC}+V_P$, the capacitor C1 is charged up to the terminal voltage $V_{S1}-(V_{DC}+V_P)$, and during the time, after one period $\tau$, that signal $\phi_1$ is $V_{DC}+V_P$, the capacitor C2 is charged up to the terminal voltage of $V_{S1}-(V_{DC}+V_P)$.

During the time that signal $\phi_2$ is $V_{DC}+V_P$ after $1.5\tau$, the capacitors C3' and C3" are both charged up to the terminal voltage of $V_{S1}-(V_{DC}+V_P)$. At this time, a charge of $a3C\{(V_{DC}+2V_P)-V_{S1}\}$ flows from the capacitor C3' through the collector of the transistor 21 in the direction of arrow $I_1$. During the time that signal $\phi_1$ is $V_{DC}+V_P$ after $2\tau$, the same charge flows through the collector of the transistor 22 in the direction of arrow $I_O$.

During the time that signal $\phi_1$ is $V_{DC}+V_P$ after $3\tau$, the charge of $a5C\{(V_{DC}+2V_P)-V_{S1}\}$ flows from the capacitor C5' through the collector of the transistor 22 in the direction of the arrow $I_O$.

Further during the time that signal $\phi_1$ is $V_{DC}+V_P$ after $4\tau$, the charge of $a7C\{(V_{DC}+2V_P)-V_{S1}\}$ flows from the capacitor C7' through the collector of the transistor 22 in the direction of the arrow $I_O$.

The amount of charge X flowing through the collector of the transistor 22 is expressed as follows:

$$X=\{(V_{DC}+2V_P)-V_{S1}\}C(a3Z^{-2}+a5Z^{-3}+\ldots) \quad (13)$$

That is, through the collector of the transistor 16 there flows a charge corresponding to the value of the input signal delayed by $2\tau, 3\tau, 4\tau \ldots$, weighted by a3, a5, a7 ... and then added.

The average value $I_{AV}$ of the current resulting from the flow of the above charge is expressed as follows:

$$I_{AV}=X/\tau=X\cdot f_c \quad (14)$$

Since the current $I_{AV}$ flows through the transistor 24, a mirror current equal to the current $I_{AV}$ flows through the transistor 26 and that current flows through the transistor 14 so that the equal current flows through the transistor 16. As a result, an amount of charge X is injected to the capacitor C2 during the corresponding one clock period ($\tau$).

Accordingly, in the example of the invention shown in FIG. 4, similar to the example of FIG. 3, the negative feedback is applied by the amount of charge X and, due to such negative feedback the transfer function H(Z) from the input terminal to the hot-end side of the capacitor C2 is expressed as follows:

$$H(Z) = \frac{Z^{-1}}{1 + a3Z^{-1} + a5Z^{-2} + \ldots} \quad (15)$$

Figure 5:
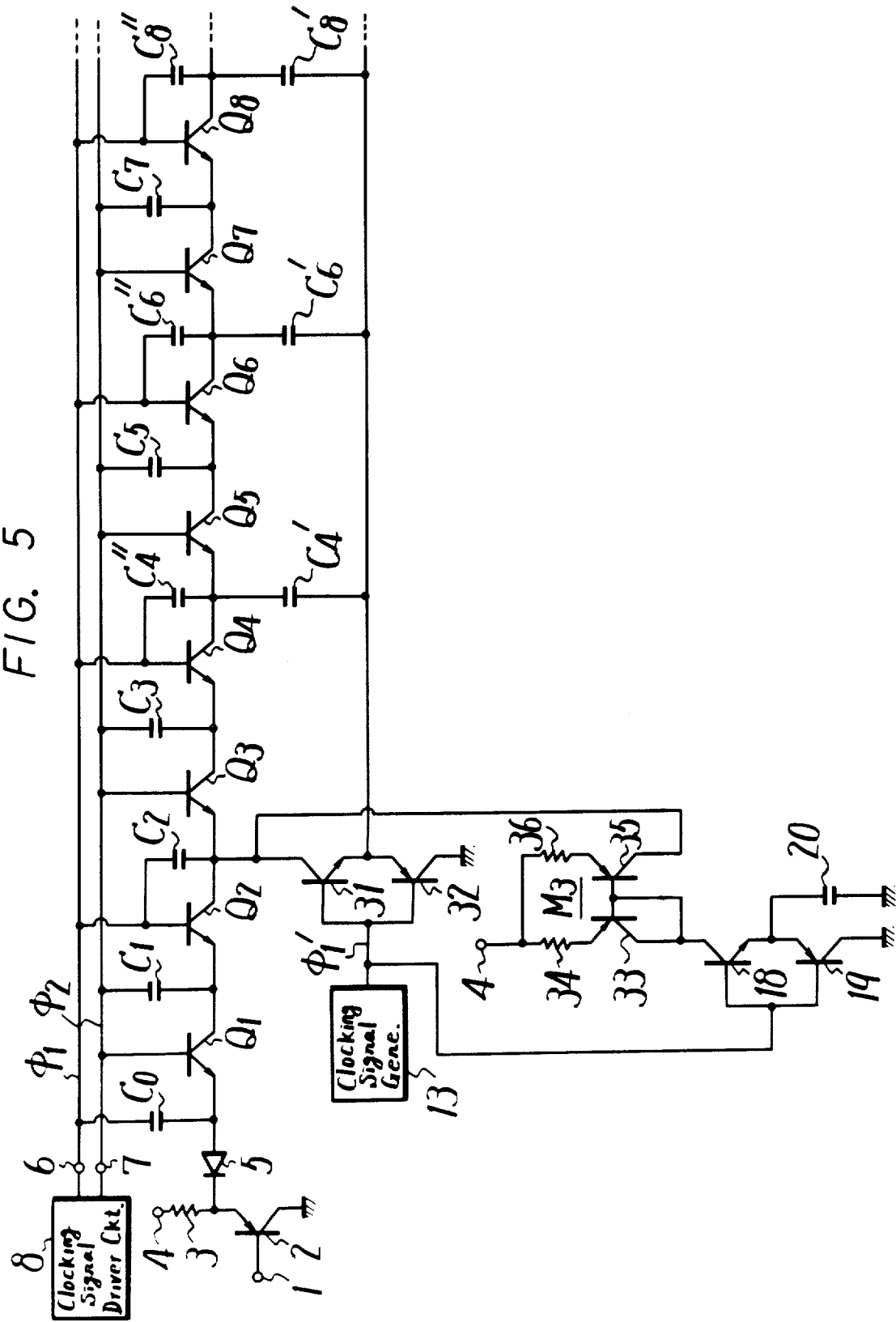

FIG. 5 shows a further example of the invention, in which a positive feedback is applied. In the example of FIG. 5, the even-numbered capacitors C4, C6, . . . are divided into pairs of capacitors C4', C4"; C6', C6"; . . . similar to the example of FIG. 3. The cold-end sides of the capacitor C4', C6', . . . are connected together to the emitters of complementary transistor 31 and 32 whose bases are connected together to the output side of the clocking signal generator 13. The collector of the NPN transistor 31 is connected to the hot-end side of the capacitor C2 and the collector of the transistor 32 is grounded. The collector of the transistor 18 in the DC correction circuit is connected to the collector and base of a PNP transistor 33 which forms part of a third current mirror circuit M3. The emitter of the transistor 33 is connected to the power supply terminal 4 through a resistor 34. The base of the transistor 33 is connected to the base of a PNP transistor 35 which together with the transistor 33 forms the third current mirror circuit M3. The emitter of the transistor 35 is connected to the power supply terminal 4 through a resistor 36 and the collector of the transistor 35 is connected to the hot-end side of the capacitor C2.

Accordingly, the sum charge X of the capacitors C4', C6', . . . can be derived from the hot-end side of the capacitor C2, and the charge transferred from the capacitor C2 is increased by the amount X. That is, positive feedback is achieved in the amount of charge X. On account of this positive feedback, the transfer function H(Z) from the input terminal to the hot-end side of the capacitor C2 is expressed as follows:

$$H(Z) = \frac{Z^{-1}}{1 - a4Z^{-1} - a6Z^{-2} - \ldots} \quad (16)$$

Figure 6:
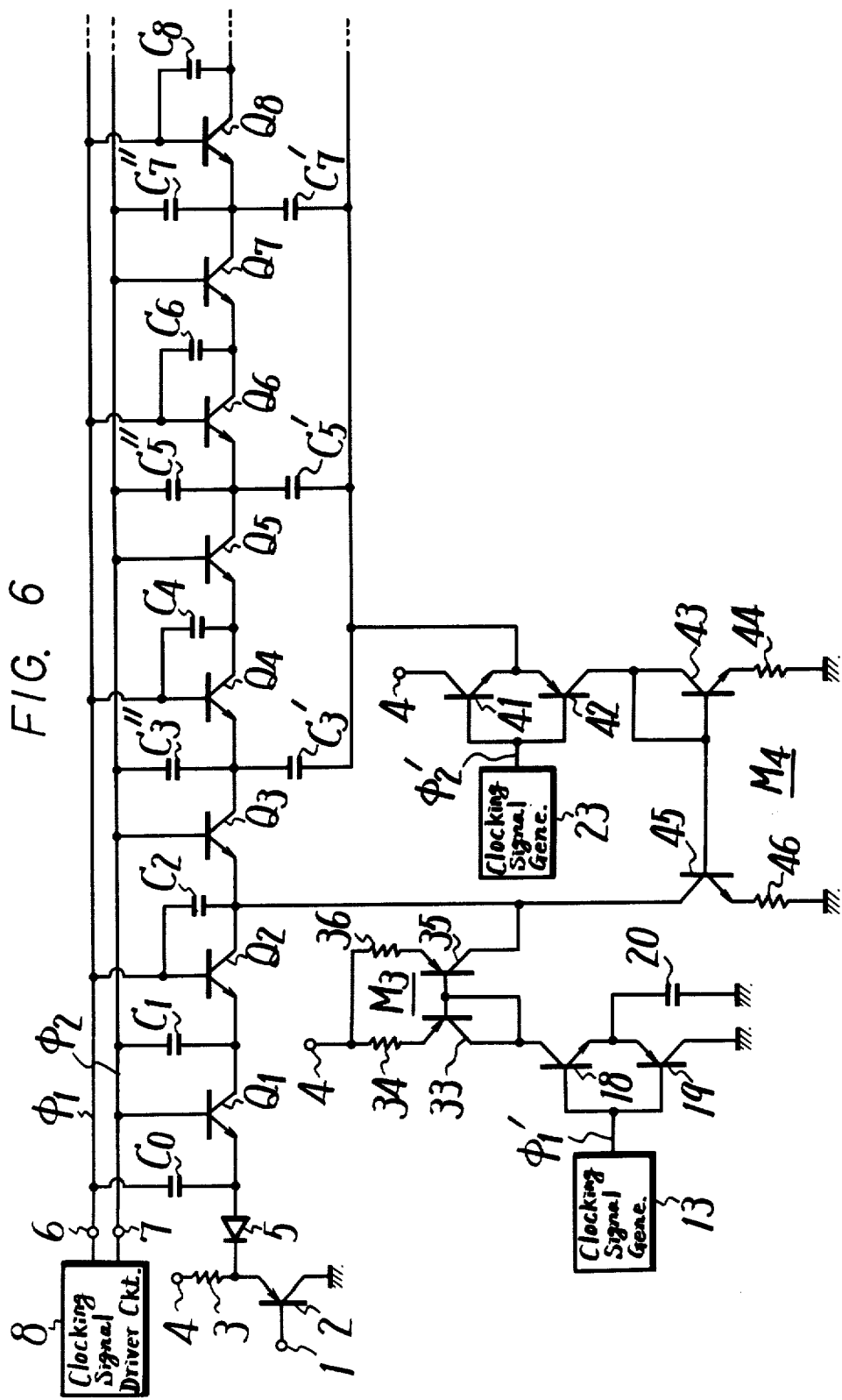

FIG. 6 shows a further example of the invention of the positive feedback type in which the feedback signal is derived from the odd-numbered capacitors so that the capacitors C3, C5, . . . are divided into pairs of capacitors C3', C3"; C5', C5"; . . . as in the example of FIG. 4. In the example of FIG. 6, the cold-end sides of the capacitors C3', C5', . . . are connected together to the emitters of complementary transistor 41 and 42 whose bases are connected together to the output side of the clocking signal generator 23. The collector of the NPN transistor 41 is connected to the power supply terminal 4, the collector of the PNP transistor 42 is connected to the collector and base of an NPN transistor 43 which together with an NPN transistor 45 forms a fourth current mirror circuit M4, and the emitter of the transistor 43 is grounded through a resistor 44. The base of the transistor 45 is connected to the base of the transistor 43 and the emitter of the transistor 45 is grounded through a resistor 46. The collector of the transistor 45 is connected to the hot-end side of the capacitor C2. The DC correction circuit is formed in the same fashion as in the example of FIG. 5.

Accordingly, the sum charge X of the capacitors C3', C5', . . . is derived from the hot-end side of the capacitor C2 and hence positive feedback occurs. The transfer function H(Z) from the input terminal to the hot-end side of the capacitor C2 of this case is as follows:

$$H(Z) = \frac{Z^{-1}}{1 - a3Z^{-1} - a5Z^{-2} - \ldots} \quad (17)$$

Figure 7:
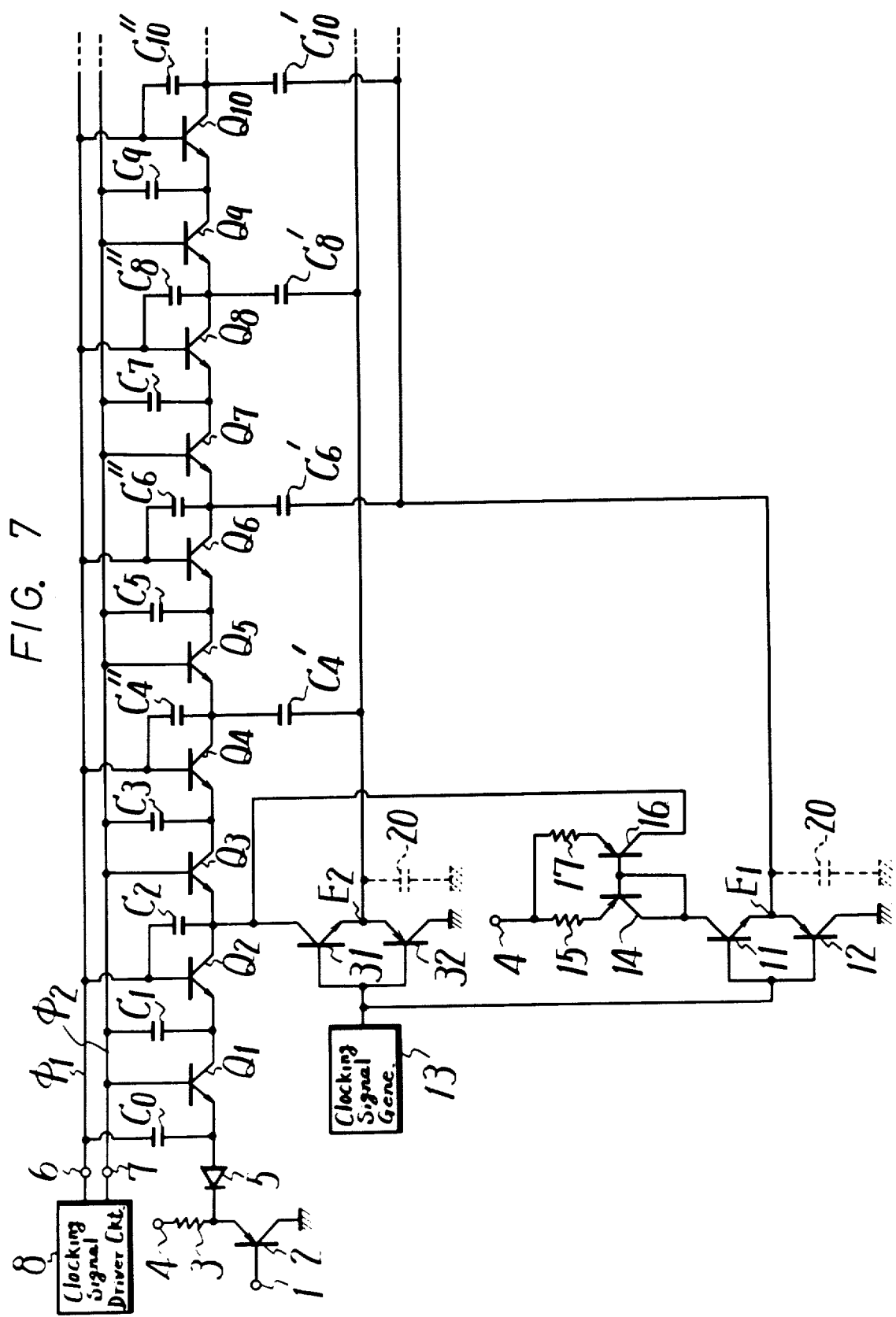

FIG. 7 shows a still further example of the invention in which the circuits shown in FIGS. 3 and 5 are used to apply both positive feedback and negative feedback. In the example of FIG. 7, the cold-end sides of alternate even-numbered divided capacitors C4', C8', . . . are connected together to the junction E2 of the emitters of the transistors 31 and 32, and the cold-end sides of remaining even-numbered divided capacitors C6', C10', . . . are connected to the junction E1 of the emitters of the transistors 11 and 12, respectively.

In the circuit of FIG. 7, the transfer function H(Z) from the input terminal to the hot-end side of the capacitor C2 is expressed as follows:

$$H(Z) = \frac{Z^{-1}}{1 - a4Z^{-1} + a6Z^{-2} - a8Z^{-3} + a10Z^{-4} \ldots} \quad (18)$$

In the circuit of FIG. 7, if the feedback signal is subjected to DC correction, the capacitor 20 can be provided either between the junction E1 of the emitters of the transistors 11, 12 and ground or between the junction E2 of the emitters of the transistors 31, 32 and the ground. That is, if the sum of the factors a4, a8, . . . at the positive feedback side is greater than the sum of the factors a6, a10, . . . at the negative feedback side, the capacitor 20, whose capacitance value Cx is determined according to the following formula (19), is connected between the junction E1 and the ground.

$$Cx = k\{(a4 + a8 + \ldots) - (a6 + a10 + \ldots)\}C \quad (19)$$

If instead the sum of the factors at the positive feedback side is smaller than that at the negative feedback side, the capacitor 20, whose capacitance value Cx is determined according to the following formula (20), is connected between the junction E2 and ground.

$$Cx = k\{(a6 + a10 + \ldots) - (a4 + a8 + \ldots)\}C \quad (20)$$

In the circuits shown in FIGS. 4 and 6 it is also possible to achieve positive and negative feedback utilizing the signals from the odd-numbered, rather than from the even-numbered, capacitors.

The above description applies whenever the factor a is smaller than 1. If instead a factor greater than 1 is required to achieve a desired transfer function, the following technique can be utilized.

For example, in the circuit of FIG. 3, the capacitances of the capacitors C4', C6', . . . are selected as $$\frac{a4}{m} C, \frac{a6}{m} C,$$

that is, the factors a4, a6, are all divided by m, where m is a constant such that $$\frac{a4}{m}, \frac{a6}{m}, \ldots$$

are all smaller than 1. Also, the capacitances of the capacitors C4'', C6'', . . . are respectively selected as $$\left(1 - \frac{a4}{m}\right) C, \left(1 - \frac{a6}{m}\right) C \ldots$$

Further, when the currents $I_a$ and $I_b$ flowing through respective transistors 14 and 16, which form the current mirror circuit M1, the transistors 14, 16 and the resistors 15, 17 are so adjusted that the relationship $$I_b/I_a = m \quad (21)$$

is satisfied. In other words, when the emitter gains of the transistors 14 and 16 are taken as Sa and Sb, respectively, the following formula (22) is satisfied.

$$S_b/S_a = m \quad (22)$$

Also, if for a given current $I_a$ flowing through the transistor 14, its emitter-base resistance is taken as $r_a$, for the corresponding current $I_b$ flowing through the transistor 16, the latter's emitter-base resistance is taken as $r_b$ and the resistances of the resistors 15 and 17 are taken as Ra and Rb. Under these conditions, the following formula (23) is satisfied.

$$(R_a + r_a)/(R_b + r_b) = m \quad (23)$$

According to the above circuit, a signal, which is 1/m of a necessary feedback signal, is obtained. This signal is amplified in the current mirror circuit M1 by a factor m, and then is injected into the capacitor C2. In this fashion, even when the factor a is greater than 1, the desired transfer function can be obtained.

Further, when the feedback signals are derived from the odd-numbered capacitors and positive feedback is used, such feedback with a factor a greater than 1 can be similarly carried out. In this case, the current amplification can be performed by either of the current mirror circuits M1 and M2 in the example of FIG. 4.

In the above circuits, the capacitance Cx of the DC correction capacitor 20 is equal to that where the factor a is less than unity.

As described above, according to the present invention, the feedback of good characteristic can be performed by a simple circuit construction.

Also in a filter circuit according to this invention, a CCD (charge coupled device) can be used in place of the BBD.

It will be apparent that many modifications and variations could be effected by one skilled in the art without departing from the spirit or scope of the present invention which are to be determined by the appended claims.

We claim as our invention:

1. A filter circuit comprising clocking signal drive means for supplying a clocking signal; clock signal generator means having an output at which a clocking control signal is provided; a transistor having first and second electrodes and a control electrode; means connecting the control electrode of said transistor to said output of said clock signal generator means; a plurality of successive capacitive storage stages for sequentially holding a charge level representing a time-sampled input signal, each of said capacitive storage stages having a clocking electrode for receiving said clocking signal so that said charge level is transferred from one to another of said capacitive storage stages in succession in response to said clocking signal, at least one of said plurality of capacitive storage stages including first and second capacitive circuit portions connected in parallel, each said first capacitive circuit portion having a clocking electrode for receiving said clocking signal and each said second capacitive circuit portion having a clocking electrode connected to the first electrode of said transistor; and current feedback means for detecting the current flowing through the second electrode of said transistor and applying a corresponding current to one of said capacitive storage stages in advance of the at least one capacitive storage stage in which said second capacitive circuit portion is included.

2. A filter circuit according to claim 1; wherein said current feedback means includes a current mirror circuit having an input active device and an output active device, said current flowing through said transistor is supplied to said input active device, and a current proportional to the current through said input active device flows through said output active device as an output current.

3. A filter circuit according to claim 1; further comprising a second transistor complementary to the first-mentioned transistor and having first, second, and control electrodes; means connecting together the control electrodes of said first-mentioned and second transistors; means connecting together the first electrodes of said first-mentioned and second transistors; and means connecting the second electrode of said second transistor to a fixed predetermined voltage.

4. A filter circuit according to claim 3; wherein said first-mentioned and second transistors are bipolar transistors each having a base, an emitter, and a collector respectively constituting said control, first, and second electrodes.

5. A filter circuit according to claim 4; wherein said first-mentioned and second transistors each operate in the region below saturation of the emitter current.

6. A filter circuit according to claim 3; wherein a plurality of said capacitive storage stages respectively have said first and second capacitive circuit portions connected in parallel.

7. A filter circuit according to claim 3; wherein said current feedback means includes a DC correction circuit including a third transistor having first, second, and control electrodes, means connecting the control electrode of said third transistor to said clock signal generator means so that said control electrode of the third transistor is supplied with said clocking control signal, means connecting the first electrode of said third transistor to said one capacitive storage state which is in advance of the at least one stage in which the second capacitive circuit portion is included, and coupling means for capacitively connecting the second electrode of said third transistor to a fixed voltage, the capacity of said one capacitive storage stage which is in advance being selected in relation to that of said coupling means for correcting the DC level in said filter circuit.

8. A filter circuit according to claim 7; wherein said DC correction circuit further includes a fourth transistor complementary to said third transistor and having first, second, and control electrodes, means connecting together the control electrodes of said third and fourth transistors, means connecting together the first electrodes of said third and fourth transistors, and means connecting the second electrode of said fourth transistor to a fixed voltage.

9. A filter circuit according to claim 1; wherein said clocking signal is constituted by a pair of clock signals 180° out of phase in respect to each other.

10. A filter circuit according to claim 1; wherein each of said capacitive storage stages comprises a capacitor having two electrodes, one of the two electrodes of each said storage stage being said clocking electrode and the other of said two electrodes of each said storage stage being a non-clocking electrode; said filter circuit further comprising a plurality of transfer transistors of like polarity, each of said transfer transistors being operative to control the transfer of charge from a respective one of said capacitors to a succeeding one of said capacitors and each having a control electrode, an input electrode, and an output electrode, said transfer transistors being connected in series at said input and output electrodes thereof, and said non-clocking and clocking electrodes of each of said capacitors being connected to the input and control electrodes, respectively, of a respective one of said transfer transistors.

* * * * *